United States Patent [19]

Hongu

[11] 4,165,498
[45] Aug. 21, 1979

[54] VARIABLE DELAY DEVICE

[75] Inventor: Masayuki Hongu, Kawasaki, Japan

[73] Assignee: Sony Corporation, Tokyo, Japan

[21] Appl. No.: 871,850

[22] Filed: Jan. 24, 1978

[30] Foreign Application Priority Data

Feb. 10, 1977 [JP] Japan ............................. 52/13988

[51] Int. Cl.² ..................... H03H 9/30; H03H 9/00; H01L 41/12; H01L 41/20
[52] U.S. Cl. ................................. 333/144; 333/147; 333/148
[58] Field of Search .............. 333/29, 71, 30 M, 70 R; 365/157

[56] References Cited

U.S. PATENT DOCUMENTS 2,913,680   11/1959   Porter et al. .................... 333/30 M
3,034,077   5/1962    Kretzmer et al. ............... 333/30 M Primary Examiner—Alfred E. Smith
Assistant Examiner—Marvin Nussbaum
Attorney, Agent, or Firm—Lewis H. Eslinger; Alvin Sinderbrand

[57] ABSTRACT

A variable delay device for delaying an electrical signal includes a bar-shaped magnetostrictive member to be a transmitting path of a supersonic wave, an input transducer for converting an electric signal into a supersonic wave and an output transducer for converting a supersonic wave into an electric signal, the input and output transducers being provided at at opposite end portions of the magnetostrictive member, and a magnetic field producing device provided between the input and output transducers for supplying the magnetostrictive member with a magnetic field which varies in intensity along the elongated direction of the magnetostrictive member. The magnetic field supplied to the magnetostrictive member is controlled by a control signal applied to the magnetic field producing device to vary the Young's modulus of the magnetostrictive member. As a result, the velocity of the supersonic wave being transmitted therein is varied, to thereby control the delay time of the electric signal.

6 Claims, 9 Drawing Figures

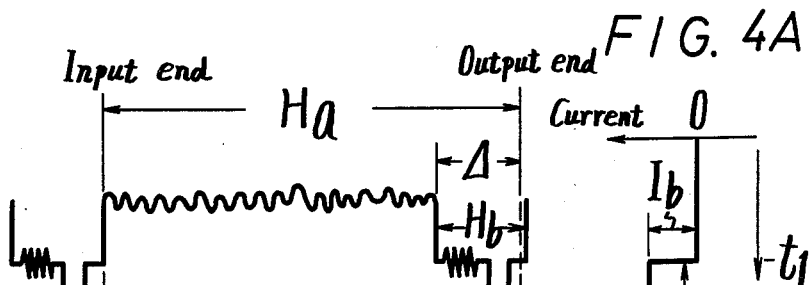
FIG. 4A
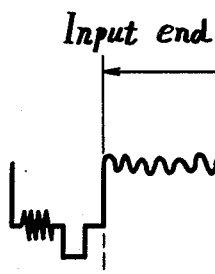
FIG. 4B
FIG. 4C
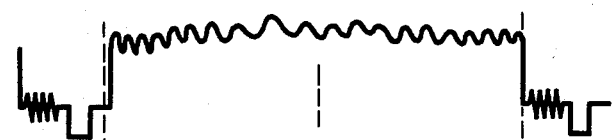
FIG. 4D
FIG. 4E
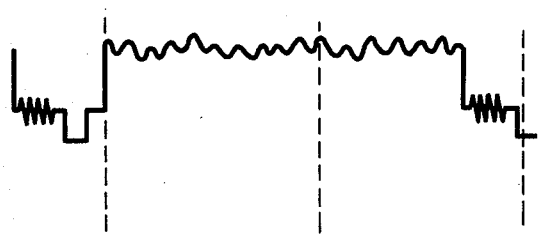
FIG. 4F
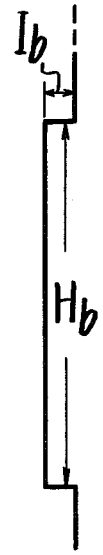

VARIABLE DELAY DEVICE

BACKGROUND OF THE INVENTION

1. Field of the Invention

This invention relates generally to a delay device in which an electrical signal is delayed by a specified time interval in passing therethrough, and more particularly to a variable delay device in which the delay time can be varied in response to a control signal applied thereto.

2. Description of the Prior Art

In general, if the length of the signal transmitting path of an electrical delay line is taken as l and the transmitting or propagating velocity of the electric signal through the signal transmitting path of the delay line is taken as v, a delay time $\tau_d$ of the electric signal is expressed as follows:

$$\tau_d = l/v$$

Various delay lines have been proposed in the art to vary the delay time of electrical signal. Two approaches taken by these known delay lines are to vary the transmitting velocity v and to substantially vary the length l of the signal transmitting path.

If the frequency of an input signal is represented by $f_1$ and the propagating velocity thereof in the delay line is represented by $v_1$, the wavelength $\lambda_1$ of the signal in the delay line is expressed as follows:

$$\lambda_1 = v_1/f_1$$

Accordingly, in the case where the delay line varies the propagating velocity v, the wavelength $\lambda$ is in proportion to the propagating velocity v in the stationary state. However, when this delay line is used in a VTR (Video tape recorder) to correct jitter in a reproduced video signals, the delay time is varied in step like fashion during the horizontal blanking period $H_b$. Since the wavelength of the signal applied to the delay line by the propagating velocity $v_1$ immediately before the variation, is $\lambda_1$ the output frequency $f_z$ during the transient period immediately after the time when the propagating velocity is changed from $v_1$ to $v_2$ to the time when the delay time becomes $\tau_{d2}$ is expressed as follows;

$$f_2 = v_2/\lambda_1 = (v_1/\lambda_1) \cdot (v_2/v_1) = f_1 \cdot (\tau_{d1}/\tau_{d2})$$

Thus, this method is defective in that the frequency $f_1$ of the input signal is different from the frequency $f_2$ of the delayed output signal during the transient period.

In the known method which substantially varies the length l of the signal transmitting path of the delay line, the above defect does not occur. However, varying the length l requires mechanical operations which prevent high speed changing of the delay time.

OBJECTS OF THE INVENTION

It is an object of the present invention to provide an improved variable delay device which avoids the defects inherent in the above described prior art.

Another object of the present invention is to provide a variable delay device in which the delay time of the signal can be varied quite rapidly under a high speed control without causing distortions in the delayed output signal.

The other objects, features and advantages of the present invention will become apparent from the following description taken in conjunction with the accompanying drawings through which the same numerals and symbols designate the same elements and components.

BRIEF DESCRIPTION OF THE DRAWINGS

FIG. 4A to FIG. 4F are schematic waveform diagrams used for explanation of the video signal control device shown in FIG. 3.

DESCRIPTION OF THE PREFERRED EMBODIMENTS

An embodiment of the variable delay device according to the present invention, which is employed for correcting the jitter in video signals reproduced by a VTR, will be hereinafter described with reference to FIGS. 1 to 4F.

Figure 1:
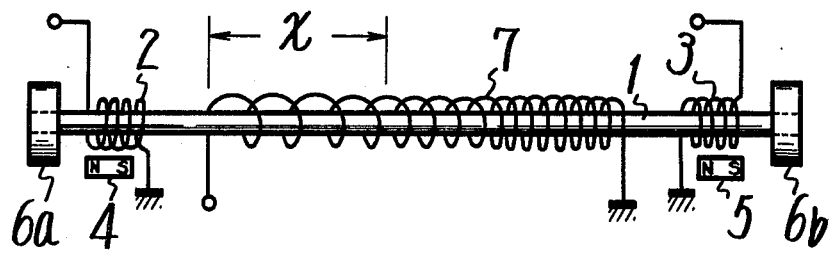
FIG. 1 shows a schematic view of one embodiment of a variable delay device in accordance with the present invention.

FIG. 1 shows one example of the variable delay device according to the present invention. In FIG. 1, a bar-shaped magnetostrictive member 1 is made of an amorphous magnetic material containing iron Fe the Young's modulus of which is varied greatly by a magnetic field applied thereto. Due to the large variation of the Young's modulus the propagation velocity of a supersonic wave signal through the bar-shaped magnetostrictive member 1, can be varied. It is known that the delay time of a signal propagating through a bar-shaped magnetostrictive member whose Young's modulus is variable, can be easily changed by applying a magnetic field to the member.

Figure 2:
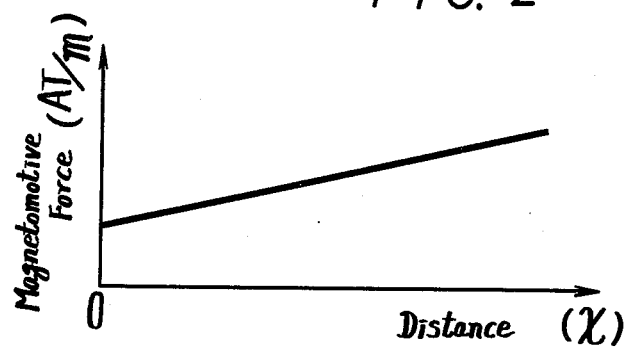
FIG. 2 is a schematic graph used for explanation of the embodiment of the variable delay device shown in FIG. 1.

An input transducer 2 for converting an electric signal into a supersonic wave signal is provided on one end portion of the bar-shaped magnetostrictive member 1, and an output transducer 3 for converting a supersonic wave signal to an electric signal is provided at the other end portion thereof. In this case, the input transducer 2 and output transducer 3 are similar in construction. For example, they are made by winding coils on non-contact bobbins (not shown) through which the bar-shaped magnetostrictive member 1 passes. Magnets 4 and 5 are also located at the opposing end portions of the member 1 for applying bias magnetic fields to the input transducer 2 and output transducer 3, respectively. Damping pads 6a and 6b are located at both ends of the bar-shaped magnetostrictive member 1 to support the latter and also to avoid the reflection of the supersonic wave signal at the ends. A means 7 for applying or producing a magnetic field is provided the bar-shaped magnetostrictive member 1 between the input transducer 2 and output transducer 3. In this case, the magnetic field producing means 7 is selected to vary the distribution of the magnetic field along the elongated direction of the bar-shaped magnetostrictive member 1. In the illustrated example, the magnetic field producing means 7 is formed of a coil wound on the magnetostrictive member 1 between the input transducer 2 and output transducer 3 and the winding density or distribution of the coil is changed gradually from the input transducer 2 to the output transducer 3. The example, the coil 7 is least densely wound at the point nearest the input transducer 2 and is wound with gradually increasing density towards the output transducer 3. A control current is applied to the coil to produce a magnetomotive force M(AT/m) in the coil 7 which magnetomotive force M is expressed as follows:

$$M = kx + M_o$$

where k is a constant, x is the distance from the end of the coil 7 nearest the input transducer 2 and $M_o$ is a bias magnetomotive force. The magnetomotive force characteristic of this example is shown in the graph of FIG. 2. As the magnetomotive force M increases the velocity of the supersonic wave signal propagating through the magnetostrictive member 1 increases and the propagating time i.e. delay time of the signal by the magnetostrictive member 1 decreases.

Figure 3:
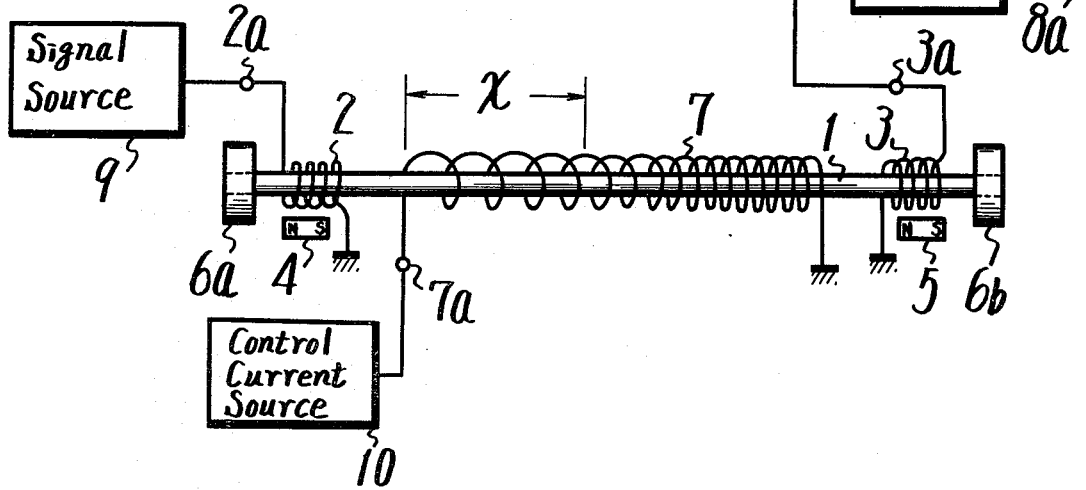
FIG. 3 shows a schematic view of one embodiment of a video signal control device utilizing a variable delay device in accordance with the present invention.

In the embodiment of FIG. 3, a signal source 9 supplies video signals such as those reproduced by a VTR and is connected to an input terminal 2a of the input transducer 2. An amplifier 8 is connected to an output terminal 3a of the output transducer 3 and provides an output signal to an output terminal 8a. Further a control current source 10 is connected to an input terminal 7a of the magnetic field producing means 7 for applying thereto control current to correct "jitter" in the reproduced video signals.

The operation of the above delay line in correcting reproduced video signals will be described with reference to FIGS. 4A to 4F. In this case, a control current shown in FIG. 4A is applied to the input terminal 7a of magnetic field producing means 7. In FIG. 4A, the ordinate represents time and the abscissa represents the control current, respectively. A control current $I_b$ is changed in magnitude in accordance with the time axis change of the video signal. In this example, "jitter" produced by the horizontal period of the video signal being shorter than a normal signal period Ha by a time Δ is corrected. In FIG. 4A, $H_b$ represents a time period corresponding to the horizontal blanking period of the video signal.

In actual operation a video signal having a horizontal period shorter than the normal signal period $H_a$ by the time Δ, as shown in FIG. 4B, is passed through the delay device the input from terminal 2 to the output terminal 3. When the horizontal blanking period $H_b$ reaches the output terminal 3, for example at time $t_1$ of FIG. 4A, the magnetic field producing means 7 is supplied with the step-shaped control signal shown in FIG. 4A, causing the delay time of the variable delay means 7 to shorten due to increased magnetic field generated by the control current $I_b$. This causes the horizontal blanking period $H_b$ to pass from the delay device faster than without the increased magnetic field. Thus, the signal distribution through the variable delay means 7 within the horizontal blanking period $H_b$ is varied as shown in FIGS. 4C and 4D and the video signal is elongated. Thus, at the termination time $t_3$ of the horizontal blanking period $H_b$, as shown in FIG. 4D, the video signal portion can be made substantially equal in length to the normal signal period $H_a$ and the jitter component contained in the video signal can be corrected within the horizontal blanking period $H_b$. When the output terminal side of the variable delay device falls between the horizontal blanking periods, as shown in FIG. 4E, no control current is applied to the magnetic field producing means 7, and hence the signal applied to the input terminal of the variable delay device is delivered, without change, to its output terminal. Then, when the horizontal blanking period $H_b$ arrives again, as shown in FIG. 4F, the "jitter" of the video signal is corrected again as in to the above described manner.

As described above, according to the variable delay device of the present invention, the delay time is varied both by varying the magnitude of the magnetic field with respect to time, by varying the current signal in the magnetic field producing means 7 and by varying the magnetic field along the length of the magetostrictive member 1. Accordingly, the velocity v and wavelength λ of the supersonic wave signal propagating through the variable delay device are substantially varied at the same time. As a result, a delayed output signal can be produced without changing the frequency thereof, thus avoiding the introduction of distortion.

Further, with the variable delay device according to the present invention, the delay time of the signal is controlled by the current applied to the magnetic field producing means 7, and thus the delay time can be controlled at high speed.

The example shown in FIG. 3 corrects "jitter" produced when the horizontal period of the video signal becomes shorter than the normal signal period $H_a$. In addition, a similar application of the present invention can be used to correct "jitter" produced by the horizontal signal period being longer than the normal signal period $H_a$. This is accomplished by using a producing means 7 which produces a magnetic field distribution opposite to that produced by the example of FIG. 3.

It will be apparent that many modifications and variations can be effected by those skilled in the art without departing from the novel concepts of the present invention, and the scope of the claims of the present invention should be interpreted accordingly.

I claim as my invention:

1. A device for variably delaying an electrical signal, comprising: an elongated magnetostrictive member made of a material the Young's modulus of which is variable in response to variations in the intensity of a magnetic field applied thereto; an input transducer located at one end portion of said magnetostrictive member for converting the electrical signal to be delayed into a supersonic wave within said magnetostrictive member; an output transducer located at the other end portion of said magnetostrictive member for converting supersonic waves within said magnetostrictive member into an electrical signal; and means for producing a magnetic field along said magnetostrictive member between said input and output transducers, which magnetic field varies monotonically in intensity along the direction of elongation of said magnetostrictive member.

2. A device according to claim 1, wherein said magnetic field producing means includes a coil wound on and extending along said magnetostrictive member and having a winding distribution which varies monotonically in said direction of elongation of said magnetostrictive member to produce the monotonic variation of magnetic field intensity along said magnetostrictive member.

3. A device according to claim 1, further comprising a pad member for supporting each end of said magnetostrictive member and avoiding the reflection of the supersonic waves thereat.

4. A device according to claim 1, wherein said magnetostrictive member comprises amorphous magnetic material.

5. A device according to claim 2, wherein said coil is wound on said magnetostrictive member to produce the highest intensity of the magnetic field at a portion of the coil closest to said output transducer.

6. A device according to claim 1, further including means for varying the magnetic field of said producing means with respect to time.

* * * * *